US007807489B2

(12) United States Patent
Takahashi et al.

(10) Patent No.: US 7,807,489 B2
(45) Date of Patent: Oct. 5, 2010

(54) LIGHT-EMITTING DEVICE WITH A PROTECTION LAYER TO PREVENT THE INTER-DIFFUSION OF ZINC (ZN) ATOMS

(75) Inventors: Mitsuo Takahashi, Yokohama (JP); Kenji Hiratsuka, Yokohama (JP); Akiko Kumagai, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 218 days.

(21) Appl. No.: 12/213,392

(22) Filed: Jun. 18, 2008

(65) Prior Publication Data

US 2009/0010291 A1    Jan. 8, 2009

Related U.S. Application Data

(63) Continuation-in-part of application No. 12/153,081, filed on May 13, 2008.

(30) Foreign Application Priority Data

| May 15, 2007 | (JP) | ............................ P2007-129788 |
| Jun. 19, 2007 | (JP) | ............................ P2007-161724 |
| Jun. 19, 2007 | (JP) | ............................ P2007-161725 |

(51) Int. Cl.
*H01L 21/00* (2006.01)

(52) U.S. Cl. ............................ 438/39; 438/40; 438/41; 438/737; 438/739; 438/924; 257/E21.246; 257/E25.032; 257/E31.099; 257/E31.105

(58) Field of Classification Search ................... 438/39, 438/40, 41, 737, 73, 924, FOR. 108, FOR. 157, 438/FOR. 169; 257/E21.246, E25.032, E31.099, 257/E31.105
See application file for complete search history.

(56) References Cited

U.S. PATENT DOCUMENTS

| 4,648,940 | A | * | 3/1987 | Menigaux et al. ............. 438/40 |
| 4,972,238 | A | * | 11/1990 | Tanaka ................... 372/45.01 |
| 5,253,264 | A | * | 10/1993 | Suzuki et al. ............ 372/45.012 |
| 6,110,756 | A | * | 8/2000 | Otsuka et al. ................. 438/41 |
| 6,618,411 | B1 | | 9/2003 | Takiguchi et al. |
| 2004/0125843 | A1 | * | 7/2004 | Kawanishi et al. ............ 372/46 |
| 2004/0213313 | A1 | * | 10/2004 | Akulova et al. ............... 372/46 |
| 2005/0040413 | A1 | * | 2/2005 | Takahashi et al. ............. 257/96 |

FOREIGN PATENT DOCUMENTS

JP        2002-26453        1/2002

* cited by examiner

*Primary Examiner*—Thanh V Pham
(74) *Attorney, Agent, or Firm*—Smith, Gambrell & Russell, LLP

(57) ABSTRACT

A light-emitting device with a protection layer for Zn inter-diffusion and a process to form the device are described. The device of the invention provides an active layer containing aluminum (Al) as a group III element, typically AlGaInAs, and protection layers containing silicon (Si) to prevent the inter-diffusion of zing (Zn) atoms contained in p-type layers surrounding the active layer. One of protection layers is put between the active layer and the p-type cladding layer, while, the other of protection layers is disposed between the active layer and the p-type burying layer.

5 Claims, 15 Drawing Sheets

LIGHT-EMITTING DEVICE WITH A PROTECTION LAYER TO PREVENT THE INTER-DIFFUSION OF ZINC (ZN) ATOMS

CROSS REFERENCE TO RELATED APPLICATIONS

The present application is a continuous-in-part application of U.S. patent application, serial number of which is Ser. No. 12/153,081, filed on May 13, 2008, entitled "Light-emitting device and a method for producing the same", which is incorporated herein by reference in its entirety.

BACKGROUND OF THE INVENTION

1. Field of the Invention

The present invention relates to a semiconductor light-emitting device, typically a semiconductor laser diode (hereafter denoted as LD), and a process to form the LD.

2. Related Background Art

It is well known in the field that an LD with a mesa structure buried with p-type and n-type burying layers, in particular, when the p-type layer contains Zn atoms as a p-type dopant material, the Zn atoms may inter-diffuse into the active layer and may cause the less reliability of the device and the degradation of the performance of the device. A Japanese Patent Application published as JP-H07-254750A has disclosed such phenomena appeared in the device with a Zn-doped layer.

SUMMARY OF THE INVENTION

One aspect of the present invention relates to a semiconductor light-emitting device that comprises a semiconductor substrate, a mesa on the semiconductor substrate, a burying layer to bury the mesa. The feature of the device of the invention is that the mesa includes an active layer containing aluminum (Al) as a group III element and at least one protection layer doped with silicon (Si) that prevents the inter-diffusion of zinc (Zn) atoms contained in the p-type layers surrounding the active layer.

In a case where the upper p-type cladding layer is doped with zinc (Zn), the protection layer is put between the active layer and the upper cladding layer, while, in another case where the burying layer includes first to third layers and at least one of the first to third layers is doped with Zn, the active layer provides recessed portions in both sides thereof filled with the protection layer doped with Si to prevent the inter-diffusion of Zn atoms from the burying layer into the active layer.

Another aspect of the present invention relates to a method to form the semiconductor light-emitting device. The method comprises steps of: (a) growing a stack of semiconductor layers including a lower cladding layer, an active layer, and an upper cladding layer on the semiconductor substrate, (b) etching the stack so as to form a mesa structure including the lower cladding layer, the active layer, and the upper cladding layer, (c) selectively etching the active layer so as to form recessed portions in both sides of the active layer, (d) forming the recessed portions by growing the protection layer doped with Si, and (e) burying the mesa by the burying layer. The active layer contains aluminum (Al) and the burying layer includes first to third layers, at least one of first to third layers being doped with Zn. The protection layers in both sides of the active layer may effectively prevent the inter-diffusion of Zn contains in at least one of first to third layers in the burying layer into the active layer. Thus, the less reliability and the degradation of the performance due to the Zn invasion into the active layer may be effectively prevented.

The formation of the protection layer may be carried out by the mass transportation within an atmosphere of mixed gaseous of phosphine ($PH_3$) and disilane ($Si_2H_6$) at a temperature over 570° C. The mixed gaseous may further contain arsine ($AsH_3$).

DESCRIPTION OF THE PREFERRED EMBODIMENTS

Next, preferred embodiments of the present invention will be described as referring to accompanying drawings. In the description of the drawings, the same elements will be referred by the same numerals or the symbols without overlapping explanations.

First Embodiment

Figure 1:
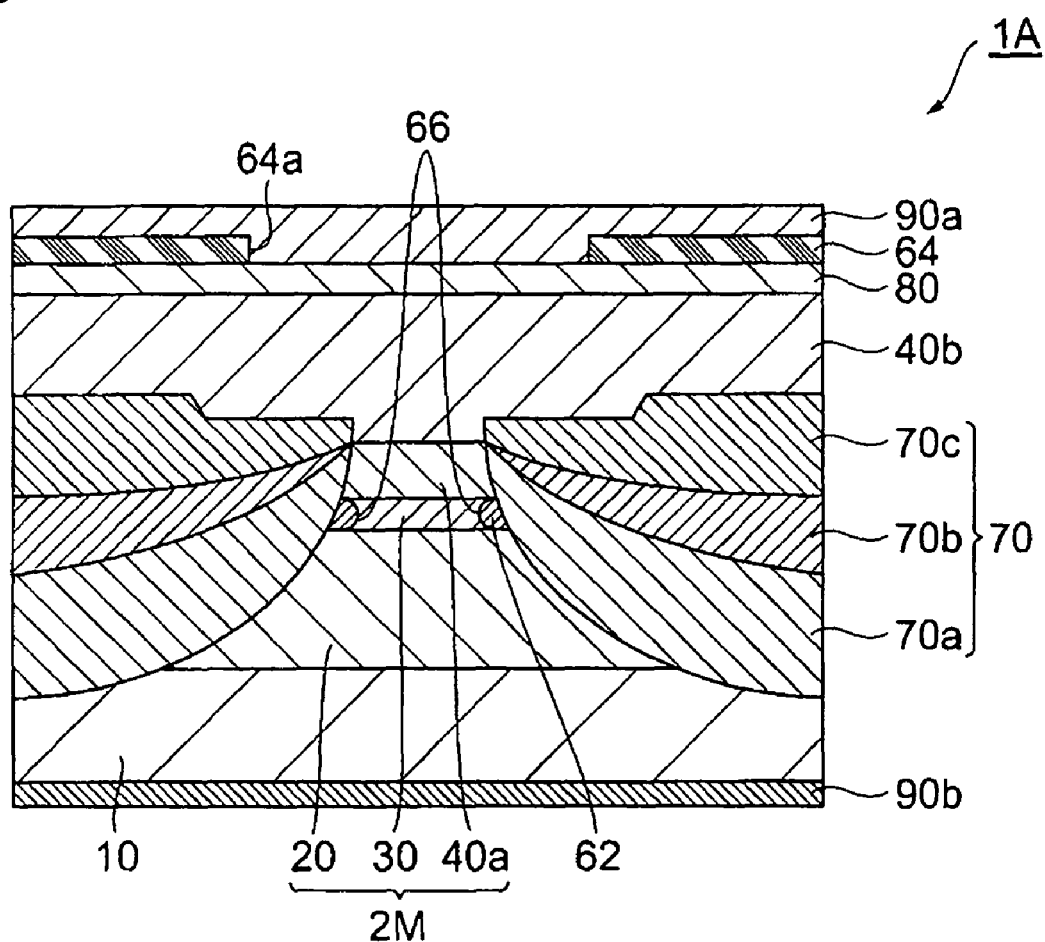
FIG. 1 schematically illustrates a cross section of a semiconductor light-emitting device according to the first embodiment of the invention.

FIG. 1 schematically illustrates a cross section of a semiconductor light-emitting device 1A according to the present invention, which may be a semiconductor laser diode (hereafter denoted as LD). This LD provides, on a semiconductor substrate 10, a mesa 2M and a burying layer 70 in both sides of the mesa. The substrate 10 may be an n-type InP doped with tin (Sn) and has a primary surface with an orientation of (001), on which the mesa 2M and the burying layer 70 are formed.

The mesa 2M, extending along the orientation of <110>, includes a lower cladding layer 20 with the n-type conduction, an upper cladding layer 40a with the p-type conduction, and an active layer 30 put between theses cladding layers, 20 and 40a. This active layer may be made of AlGaInAs and has a quantum well structure (MQW) with well layers and barrier layers alternately stacked to each other. Specifically, the active layer 30 includes ten (10) well layers each comprising AlGaInAs with a thickness of 5 nm and a band gap wavelength of 1.4 μm and eleven (11) barrier layers each comprising AlGaInAs with a thickness of 8 nm and a band gap wavelength of 1.1 μm.

The n-type lower cladding layer 20 may be an n-type InP doped with Si by a concentration of $1.0 \times 10^{18}$ μm$^{-3}$ and having a thickness of about 0.5 μm. The p-type upper cladding layer 40a may be p-type InP doped with Zn by a concentration of $0.8 \times 10^{18}$ cm$^{-3}$ and having a thickness of about 0.4 μm.

The burying layer 70 is provided in both sides of the mesa 2M so as to bury the mesa 2M. This burying layer includes, from the side close to the mesa 2M, a first layer 70a with the p-type conduction, the second layer 70b with the n-type conduction and the third layer 70c with the p-type conduction. The first layer 70a may be a p-type InP doped with Zn by a concentration of $1.0 \times 10^{18}$ μm$^{-3}$ and a thickness of about 1.0 μM at the maximum. The second layer 70b may be a n-type InP doped with Si by a concentration of $2.0 \times 10^{18}$ cm$^{-3}$ and having a thickness of about 1.0 μm at the maximum, and the third layer 70c may be a p-type InP doped with Zn by a concentration of $0.3 \times 10^{18}$ cm$^{-3}$ and having a thickness of about 0.3 μm.

The laser diode 1A further stacks another p-type cladding layer 40b and a contact layer 80 on the upper cladding layer 40a and the third layer 70c so as to cover the mesa 2M and the burying layer 70. The second upper cladding layer 40b may be a p-type InP doped with Zn by a concentration of $1.0 \times 10^{18}$ cm$^{-3}$ and having a thickness of about 1.0 μm, while, the contact layer 80 may be a p-type InGaAs doped with Zn and having a thickness of about 0.5 μm.

On the contact layer 80 is provided with an insulating film 64 made of inorganic material such as silicon oxide (SiO$_2$) and silicon nitride (SiN) with a thickness of 0.1 to 0.5 μm. This insulating film has an opening 64a aligned with the mesa 2M. Specifically, this opening 64a extends along the orientation of <110> with a width wider than a width of the mesa 2M. This insulating film 64 with the opening 63 may concentrate the current to be injected into the active layer 30. A p-type electrode 90a is formed on the insulating film 64 so as to cover the contact layer 80 exposing within the opening 64a, while, the back surface of the substrate 10 provides an n-type electrode 90b.

The LD 1A according to the present embodiment forms recessed portions 66a in both sides of the active layer 30 and a protection layer 62 is formed so as to fill these recessed portions 66. The recessed portion 66 is formed only in both sides of the active layer 30. The protection layer 62 may be an InP doped with Si and formed by the mass-transporting method.

As shown in FIG. 1, this protection layer 62 is interposed between the active layer 30 and the burying layer 70, specifically, the first layer 70a doped with Zn in the burying layer. Accordingly, even the LD 1A is placed under a high temperature condition in the subsequent process, such as the crystal growth and the electrode formation, the protection layer 62 may prevent the inter-diffusion of Zn from the first and the third layers, 70a and 70c, in the burying layer to the active layer 30, which may suppress the formation of the non-radiative centers in the active layer due to the diffused Zn atoms and, accordingly, may effectively reduce the threshold current of the device.

In a case where the active layer 30 is made of group III-V compound semiconductor material containing aluminum (Al) as a group III element, typically AlGaInAs as that in the present embodiment, the following subject may occur in addition to the diffusion of Zn atoms mentioned above, that is: the Zn diffusion into the active layer containing aluminum may induce the dislocations within the active layer 30 that degrades the reliability and shortens the lifetime of the device. The protection layer 62 described above may effectively prevent this Zn diffusion into the active layer 30, accordingly, the device shows a substantial reliability and the long lifetime even the active layer contains aluminum. Next, a process to form the device 1A will be described as referring to FIGS. 2 to 7.

Crystal Growth of Semiconductor Layers

Figure 2:
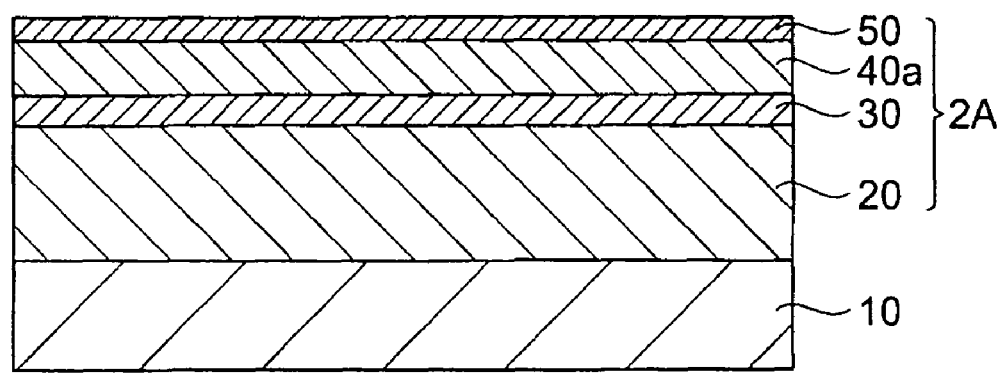
FIG. 2 illustrates a process to form the device shown in FIG. 1.

First, a stack 2A of semiconductor layers is grown on the substrate 10 as illustrated in FIG. 2. This stack 2A includes the n-type cladding layer 20, the active layer 30, the p-type cladding layer 40a and a cap layer 50. The n-type cladding layer 20 is the n-type InP doped with Si by a concentration of $1.0 \times 10^{18}$ cm$^{-3}$ and having a thickness of about 0.5 μm. The active layer 30 alternately stacks 10 well layers made of AlGaInAs with a thickness of 5 nm and a band gap wavelength of 1.4 μm and 11 barrier layers made of AlGaInAs with a thickness of 8 nm and a band gap wavelength of 1.1 μm. The thicknesses and the band gap wavelengths of the well layers and the barrier layers are selected so as to set the emission wavelength of this active layer to be 1.31 μm. The p-type cladding layer 40a is the p-type InP doped with Zn by a concentration of $0.8 \times 10^{18}$ cm$^{-3}$ and having a thickness of about 0.4 μm. The cap layer 50 is an InGaAs doped with Zn by a concentration of $0.8 \times 10^{18}$ cm$^{-3}$ and having a thickness of about 0.2 μm. These layers may be grown by the Metal Organic Vapor Phase Epitaxy (MOVPE) technique. The active layer 30 is grown at a temperature over 690° C. to prevent the capture of the oxygen during the growth.

Formation of Mesa

Figure 3:
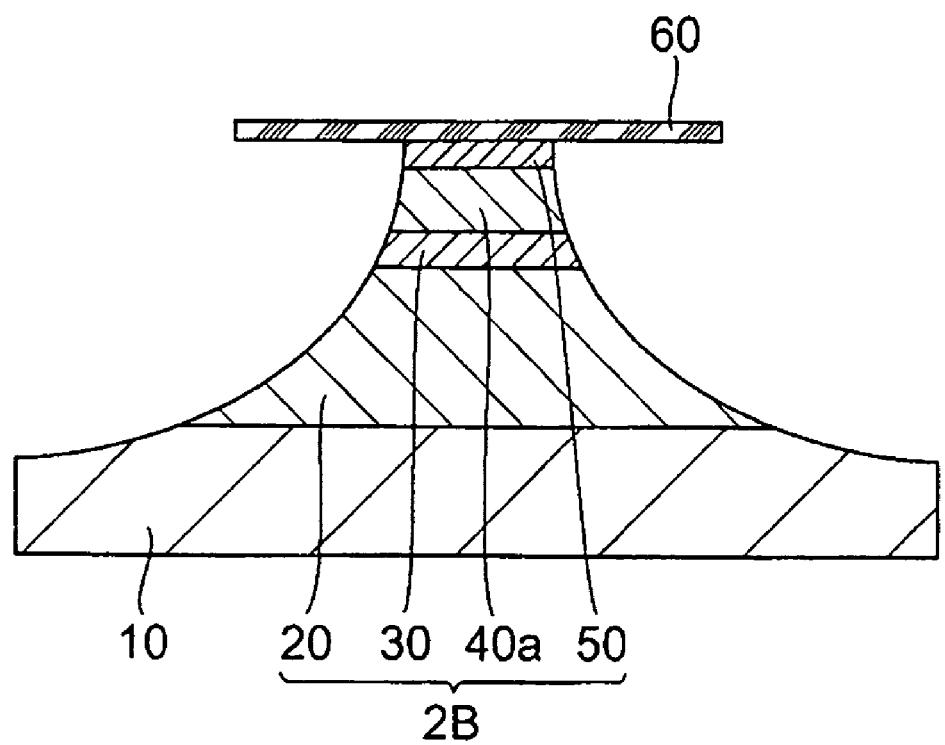
FIG. 3 illustrates a process to form the device subsequent to that shown in FIG. 2.
Figure 4:
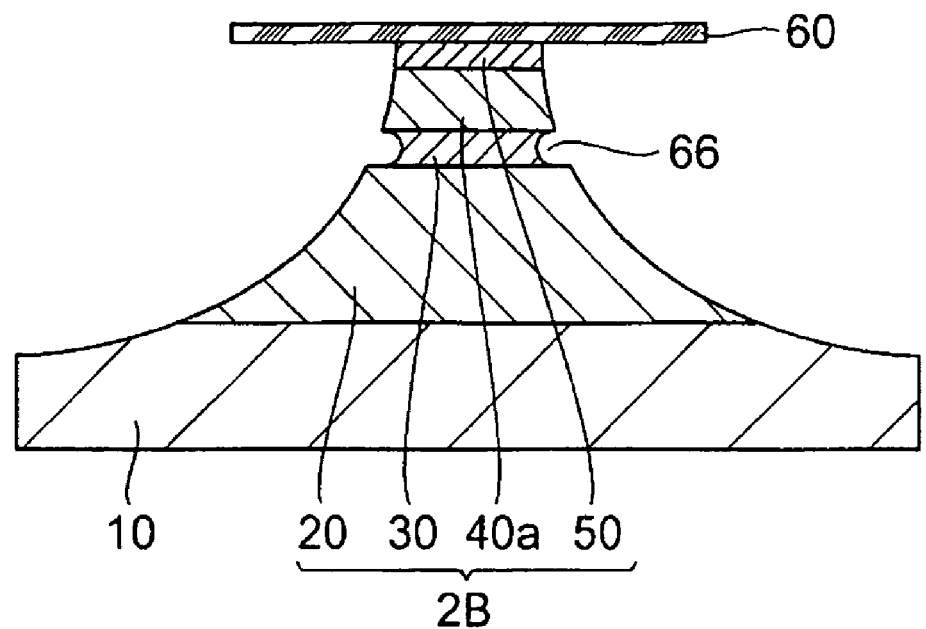
FIG. 4 illustrates a process to form the device subsequent to that shown in FIG. 3.
Figure 5:
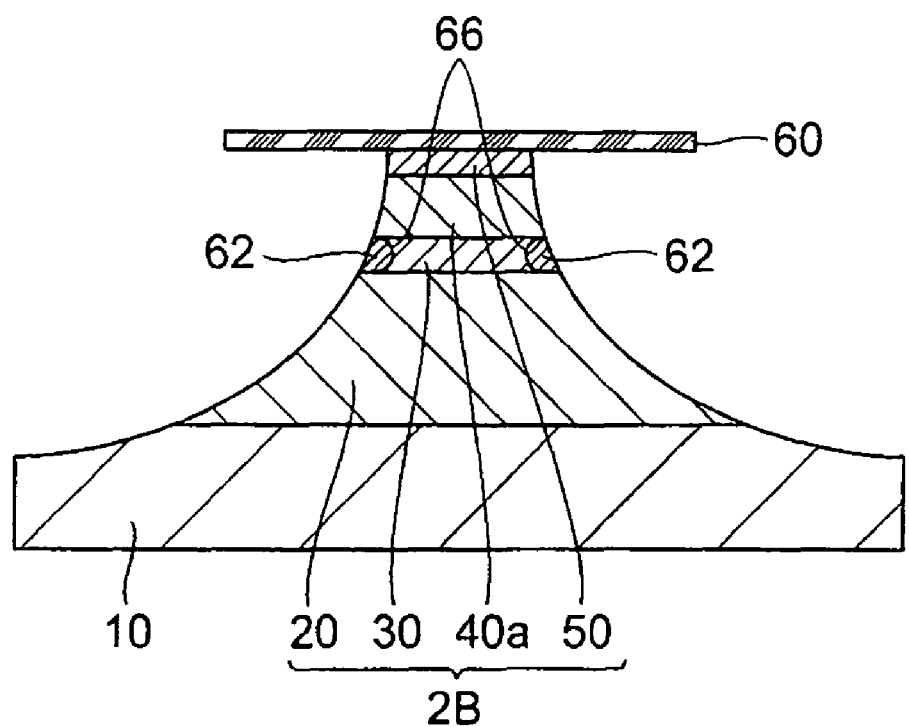
FIG. 5 illustrates a process to form the device subsequent to that shown in FIG. 4.

Next, the mesa 2B is formed as illustrated in FIG. 3. Forming an insulating film made of, for instance, silicon nitride (SiN) on the stack 2A, the conventional lithography technique processes this insulating film so as to form a stripe 60 with a width of about 1.0 μm and a length of about 300 μm along the crystal orientation of <110>. The stack 2A is wet-etched by a solution of methanol-bromide until a portion of the substrate 10 is etched, that is, the total height of the mesa 2B becomes 2.0 to 2.5 μm. Because the cap layer 50 made of InGaAs has a larger etching rate compared to the underneath cladding layer 40a, the mesa 2B shows the normal mesa shape to leave an overhung insulating film.

Formation of Recessed Portion

Next, the recessed portions 66 are formed in both sides of the active layer 30 within the mesa 2B. A selectively etching of the active layer 30 forms these recessed portions with a depth of about 0.15 μm. An etchant containing sulfuric acid, hydrogen peroxide and water with a ratio of $H_2SO_4:H_2O:H_2O=1:10:220$ may perform this selective etching.

Formation of Protection Layer

Subsequently, the protection layer 62 is grown so as to fill the recessed portion 66 by the mass-transportation of InP at a temperature over 570° C. Specifically, a thermal treatment carried out at the temperature of 685° C. as supplying mixed gaseous of phosphine (PH$_3$) and disilane (Si$_2$F$_6$) for 20 minutes forms the protection layer 62 by the mass-transportation of InP containing silicon (Si) so as to fill the recessed portion 62.

The phosphine ($PH_3$) may reduce the generation of the vacancy caused by the dissociation of phosphorous atoms from the InP crystal. The disilane ($Si_2H_{16}$) is supplied as the source of dopant atoms (Si). The flow rate of these gaseous may be 100 sccm for the $PH_3$ and 0.01 to 0.5 sccm for the $Si_2H$ as a dilution gas with a concentration of 20 ppm. In the present embodiment, the flow rate of the $Si_2H_6$ is 0.1 sccm. Arsine ($AsH_3$) may be contained as the mixed gaseous to prevent the vacancy due to dissociation of arsenic atoms from the InGaAs cap layer. It is quite hard to cause the mass transportation in a flat side of the mesa 2B without the recessed portion 66. The recessed portion 66 of the present embodiment may facilitate the mass transportation to fill the recessed portion 66.

Formation of Burying Layer

Figure 6:
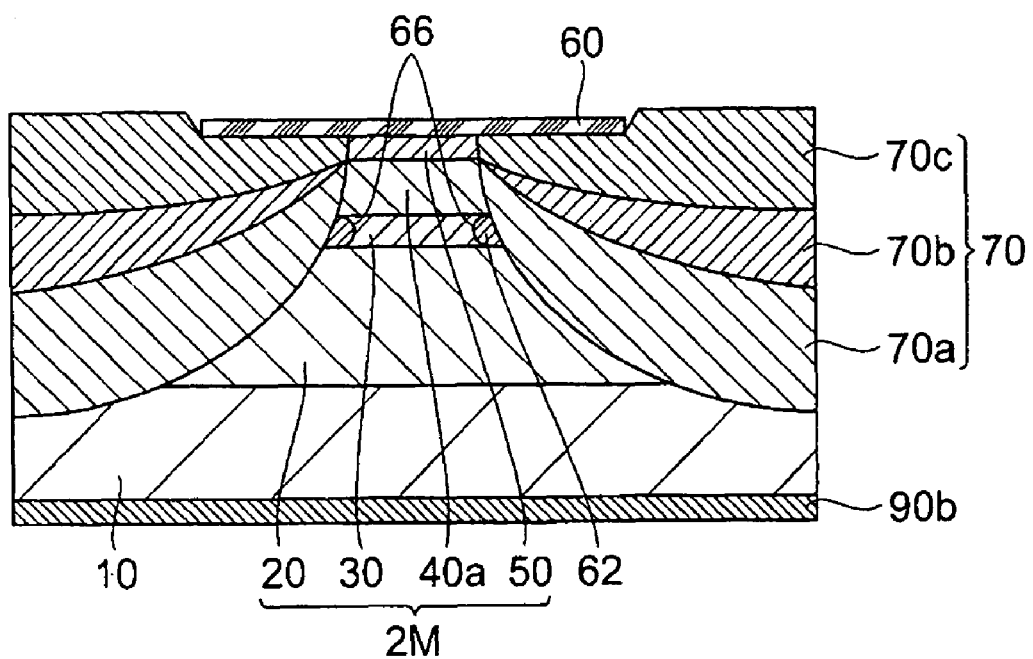
FIG. 6 illustrates a process to form the device of the first embodiment subsequent to that shown in FIG. 5.

The MOVPE technique may subsequently form the burying layer 70 as illustrated in FIG. 6. A sequential growth of the p-type first layer 70a, the n-type second layer 70b, and the p-type third layer 70c may form the burying layer 70. A source gas for the p-type layer doped with Zn may be diethylzinc (DEZ), while, that for the n-type layer doped with Si may be disilane ($Si_2H_6$). After the formation of the burying layer 70, the insulating film 60 is removed by, for instance, an aqueous solution of fluoric acid and the cap layer 50 is subsequently etched by a mixed solution of phosphoric acid and hydrogen peroxide ($H_3PO_4:H_2O_2$=5:1). Thus, the mesa 2M involving the lower n-type cladding layer 20, the MQW active layer 30 and the upper p-type cladding layer 40a may be obtained.

Formation of Second Cladding Layer and Contact Layer

Figure 7:
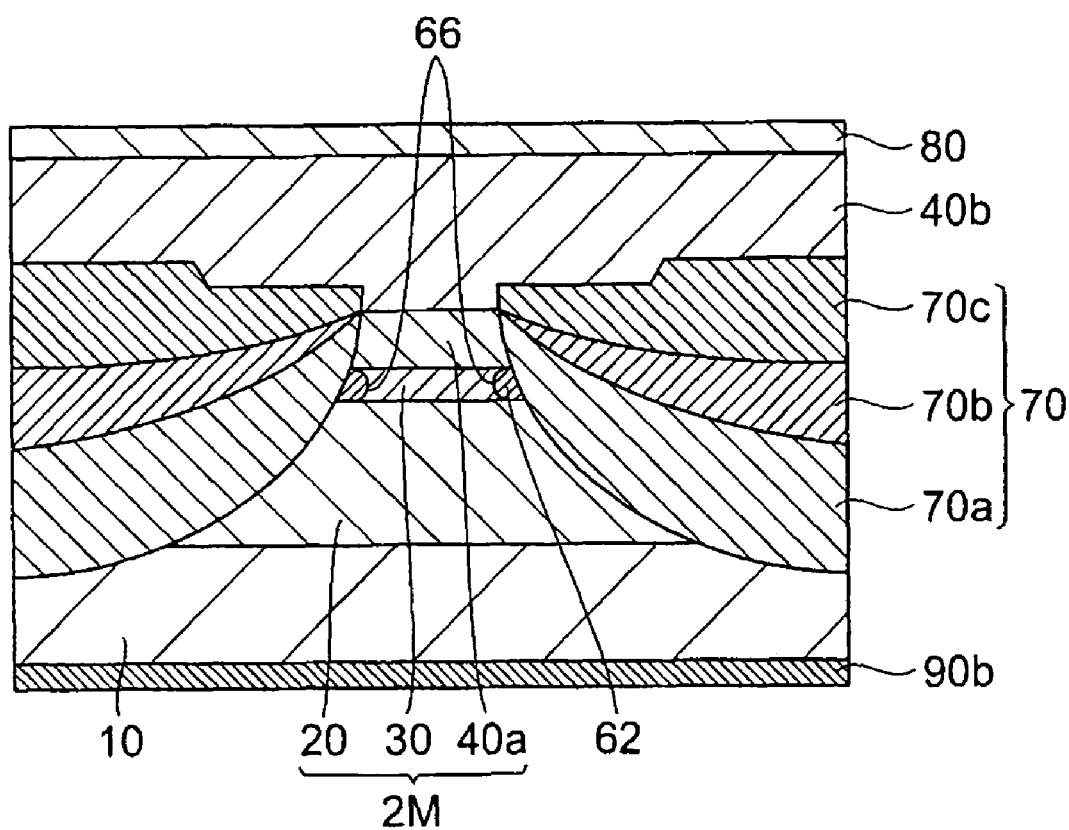
FIG. 7 illustrates a process to form the device of the first embodiment subsequent to that shown in FIG. 6.

Next, as illustrated in FIG. 7, the second upper p-type cladding layer 40b and the p-type contact layer 80 are grown by the OMVPE technique on the first upper p-type cladding layer 40a in the mesa 2M and the burying layer 70.

Formation of Insulating Film and Electrodes

On the contact layer 80 is formed with the insulating film 64 by, for instance, the chemical vapor deposition technique (CVD), and processed so as to form the opening 64a aligned with the mesa 2B by the conventional photolithography technique with a subsequent etching of the film 60. Finally, on the insulating film 64 is evaporated with the p-type electrode 90a, while the back surface of the substrate n-type electrode 90b. Prior to the formation of the n-type electrode 90b, it is preferable to thin the substrate 10 to be about 100 μm. Thus, the process to from the device 1A is completed.

The protection layer 62, in particular, Si atoms contained therein may effectively protect the Zn inter-diffusion from the p-type layers, 70a and 70c, in the burying layer 70 into the active layer 30 during the subsequent thermal processes, such as the growth of the burying layer 70, that of the second cladding layer 40b and the contact layer 80, and the formation of the electrode. Moreover, this protection layer 62 originally showing the n-type conduction due to the Si atoms doped therein is converted into the p-type conduction by the Zn atoms inter-diffused from the first and the third layers, 70a and 70c, of the burying layer 70 during the subsequent thermal process of the growth of the third layer 70c, the second cladding layer 40b, and the contact layer 80. Thus, the protection layer 62 that contains both impurities of Si and Zn finally operates as the p-type layer in both sides of the active layer 30, which may effectively confine the current within the active layer because the p-type layer shows a resistivity greater than the resistivity of the n-type layer, in particular, when these layers are made of the p-type or the n-type InP.

Second Embodiment

Figure 8:
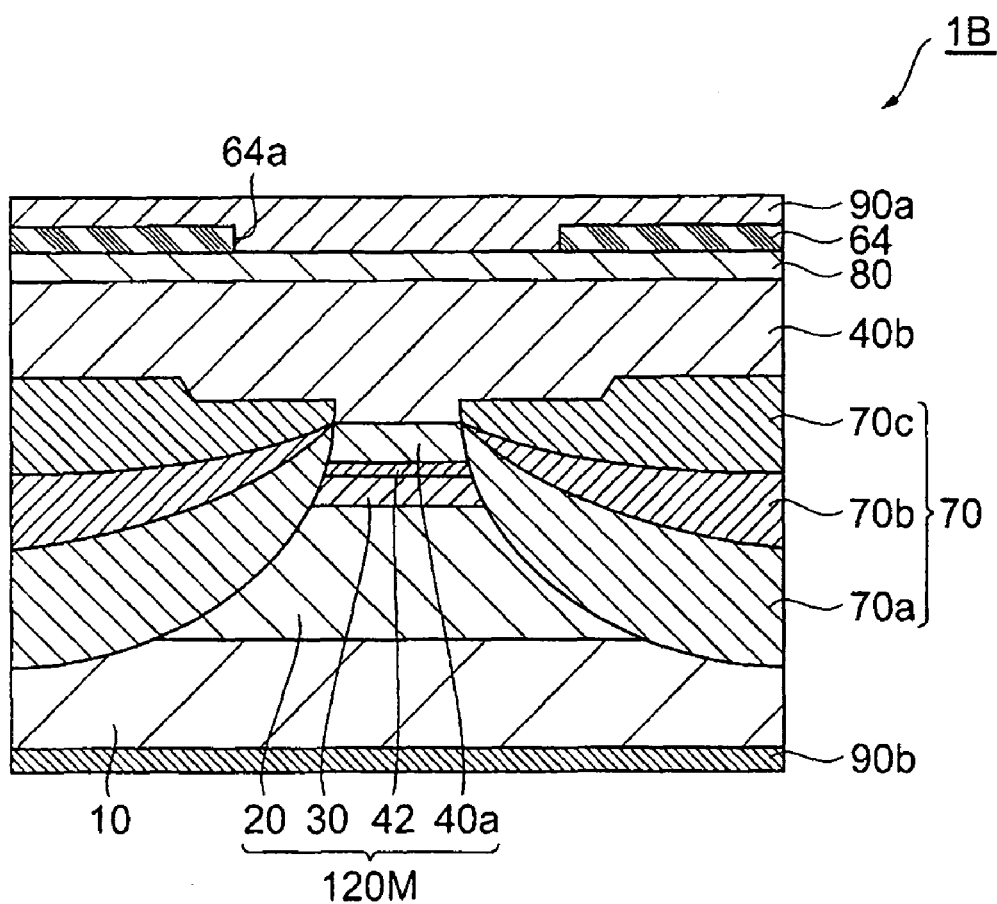
FIG. 8 schematically illustrates a cross section of a semiconductor light-emitting device according to the second embodiment of the invention.

FIG. 8 schematically illustrates a cross section of a semiconductor light-emitting device 1B, which may be also a semiconductor laser diode, according to the second embodiment of the invention. This device provides, on the semiconductor substrate 10, a mesa 120M and buying layers formed in both sides of the mesa 120M.

The device according to the second embodiment provides the mesa 120M instead of the mesa 2M in the foregoing embodiment. The mesa 120M includes the lower n-type cladding layer 20, the active layer 30, a protection layer 42, and the first upper p-type cladding layer 40a. Layers within the mesa 120M are same as those of the first embodiment except for the protection layer 42. This protection layer 42 may be InP doped with Si by a concentration of $0.2 \times 10^{18}$ $cm^{-3}$ and having a thickness of about 0.2 μm.

Because the device 1B provides the protection layer 42 between the p-type cladding layer 40a and the active layer 30 so as to directly come in contact with the active layer 30, the inter-diffusion of Zn atoms contained in the p-type cladding layer 40a may be effectively prevented by the protection layer 42 even the subsequent thermal processes, such as the growth of the semiconductor layers and the formation of the electrode, are carried out. That is, the Si atoms in the protection layer 42 may effectively stop the inter-diffusion of Zn atoms from the p-type cladding layer 40a into the active layer 30. Moreover, this protection layer 42 may be converted into the p-type layer by the Zn atoms inter-diffused and trapped therein during the subsequent thermal process, accordingly, this protection layer 42 shows a function of the p-type layer similar to the upper cladding layer 40a.

Third Embodiment

Figure 9:
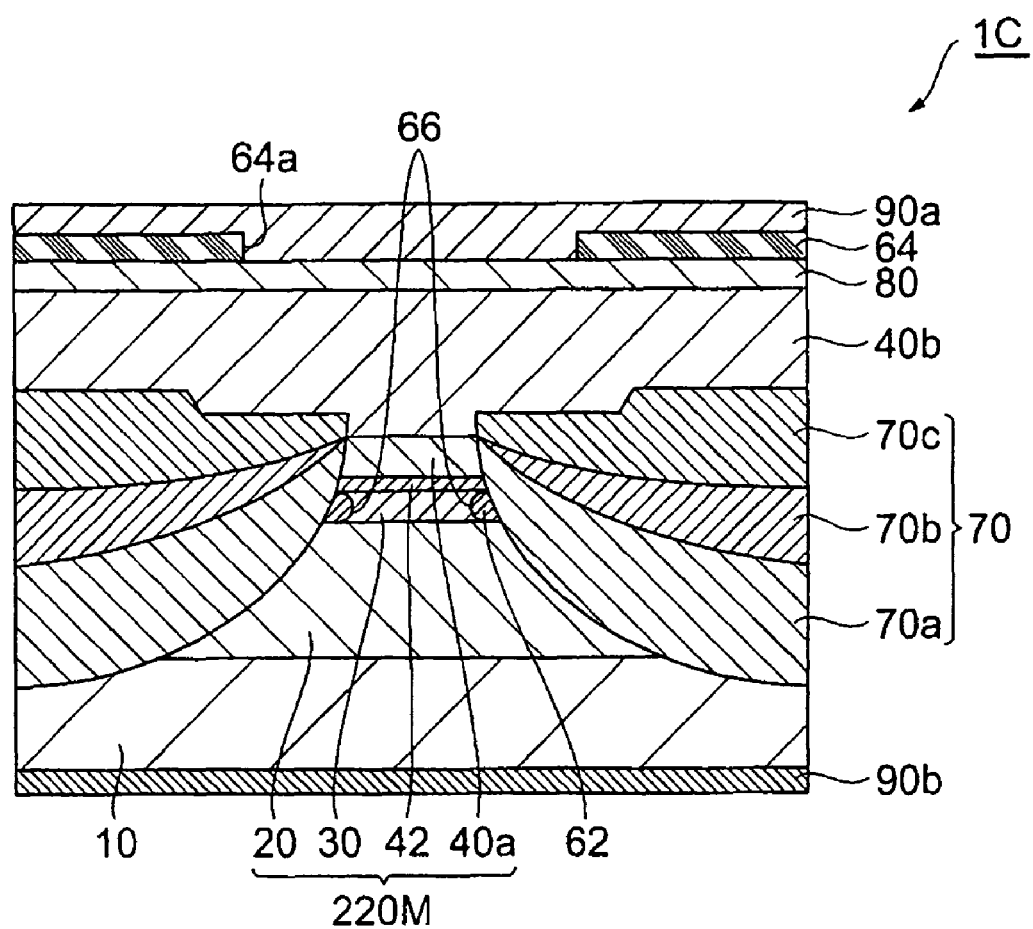
FIG. 9 schematically illustrates a cross section of a semiconductor light-emitting device according to the third embodiment of the invention.

Next, a semiconductor light-emitting device 1C, which may be also a semiconductor laser diode, according to the third embodiment of the invention. As illustrate in FIG. 9, the device 1C has a feature that it provides a first protection layer 42 between the active layer 30 and the p-type cladding layer 40a similar to those described in the foregoing embodiment and the active layer 30 provides recessed portions in both side thereof that is filled with the second protection layer 66 as those described in the first embodiment. These first and second protection layers, 42 and 62, surround the active layer and effectively prevent the inter-diffusion of Zn atoms from the p-type layers peripheral to the active layer 30 in to the active layer 30. That is, because the active layer 30 is surrounded by two protection layers, 42 and 62, the inter-diffusion of Zn atoms into the active layer 30 may be further prevented.

Next, a process to from the device 1C will be described as referring to FIGS. 10 to 15, which schematically illustrate cross sections of the device.

Growth of Semiconductor Layers

Figure 10:
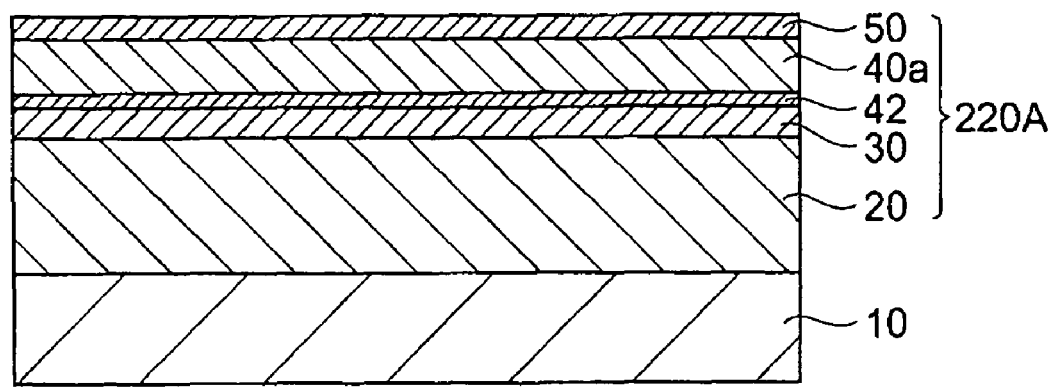
FIG. 10 illustrates a process to form the device shown in FIG. 9.

First, as illustrated in FIG. 10, a stack 220A of semiconductor layers is formed on the substrate 10. The stack 220A includes the n-type cladding layer 20, the active layer 30, the protection layer 42, the p-type cladding layer 40a and the cap layer 50. These layers have the same conditions including materials thereof with those involved in the foregoing light-emitting devices, 1A and 1B.

Formation of Mesa and Recessed Portion Filled with Protection Layer

Figure 11:
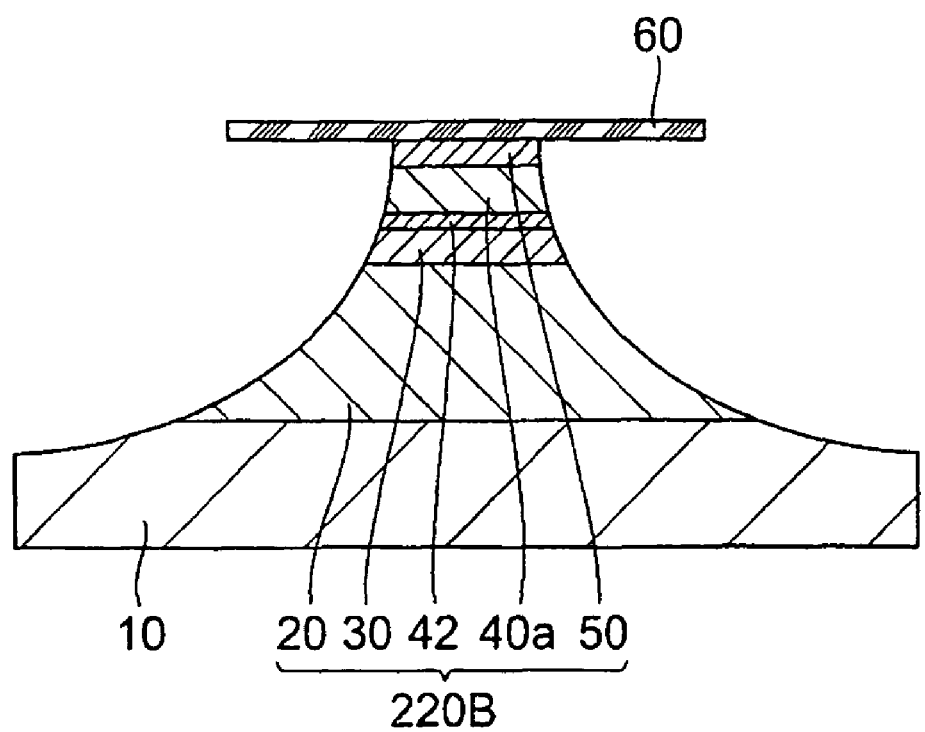
FIG. 11 illustrates a process subsequent to that shown in FIG. 10 to form the device of the third embodiment shown in FIG. 9.
Figure 12:
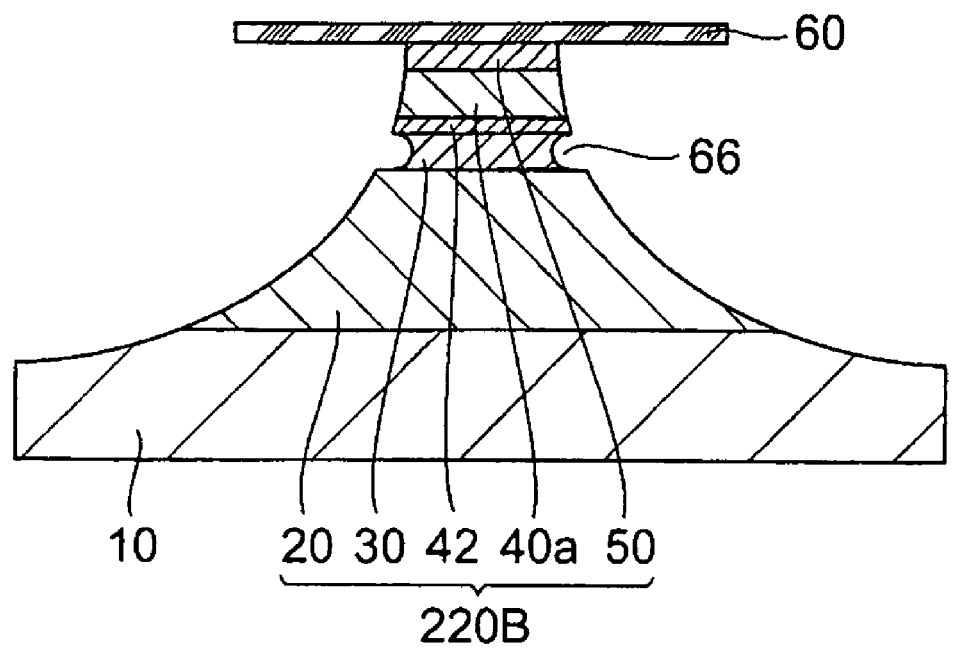
FIG. 12 illustrates a process subsequent to that shown in FIG. 11 to form the device of the third embodiment shown in FIG. 9.
Figure 13:
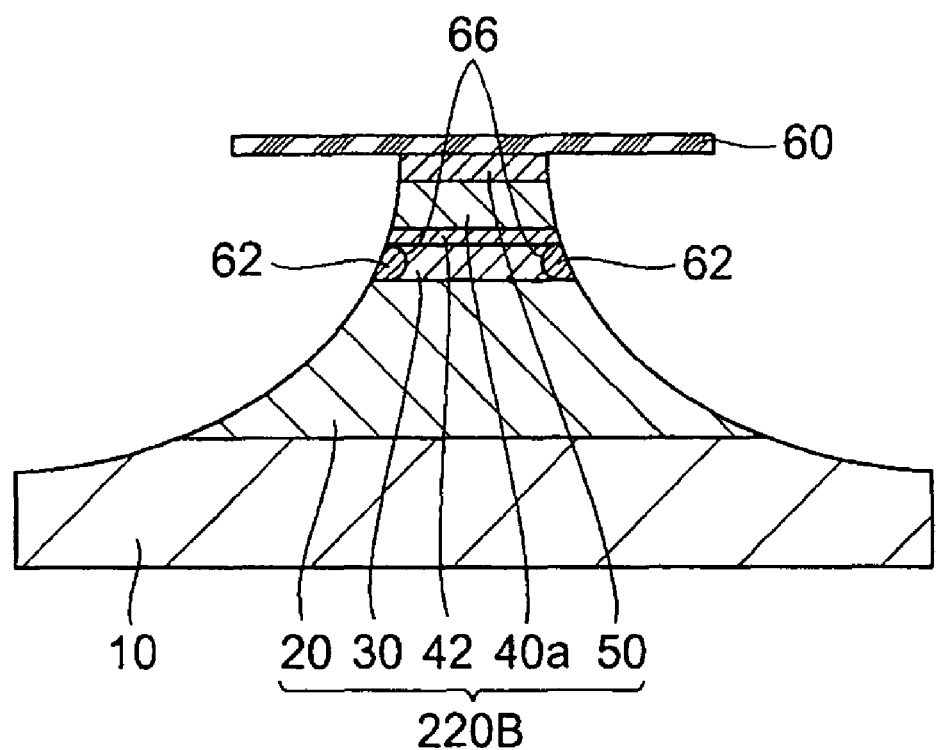
FIG. 13 illustrates a process subsequent to that shown in FIG. 12 to form the device of the third embodiment shown in FIG. 9.

Next, as illustrated in FIG. 11, a mesa 220B is formed by the wet-etching using the methanol-bromide as the etchant. Because the first protection layer 42 is made of InP, the wet-etching using methanol-bromide may etch the stack 220A as those described in the first embodiment without any steps at interfaces of respective layers. Subsequent to the formation of the mesa 220B, another etching using the mixed solution of sulfuric acid and hydrogen peroxide ($H_2SO_4$:$H_2O_2$:$H_2O$ (1:10:220)) may form the recessed portion 66 in both sides of the active layer 30 with a depth of about 0.15 μm as shown in FIG. 12. Next, as illustrate in FIG. 13, these recessed portions 66 in both sides of the active layer 30 are filled with the second protection layer 62 by the mass-transportation of InP at a temperature over 570° C.

Formation of Burying Layer

Next, the MOVPE technique may grow the burying layer 70 including the p-type first layer 70a, the n-type second layer 70b, and the p-type third layer 70c, so as to bury the mesa 220B. After the growth of the burying layer 70, the wet-etching using the fluoric acid may remove the insulating layer 60 and another etching using a mixture of phosphoric acid and hydrogen peroxide ($H_3PO_4$:$H_2O_2$ (5:1)) may remove the top cap layer 50. Thus, the mesa 220M according to the present embodiment may be obtained.

Formation of Cladding Layer and Contact Layer

Figure 14:
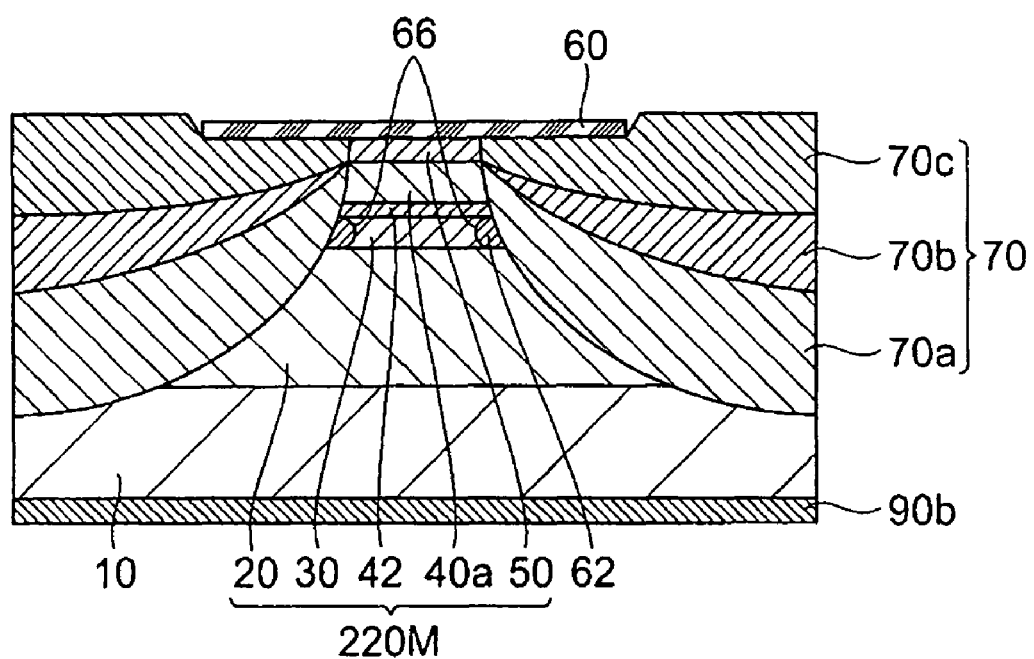
FIG. 14 illustrates a process subsequent to that shown in FIG. 13 to form the device of the third embodiment shown in FIG. 9.
Figure 15:
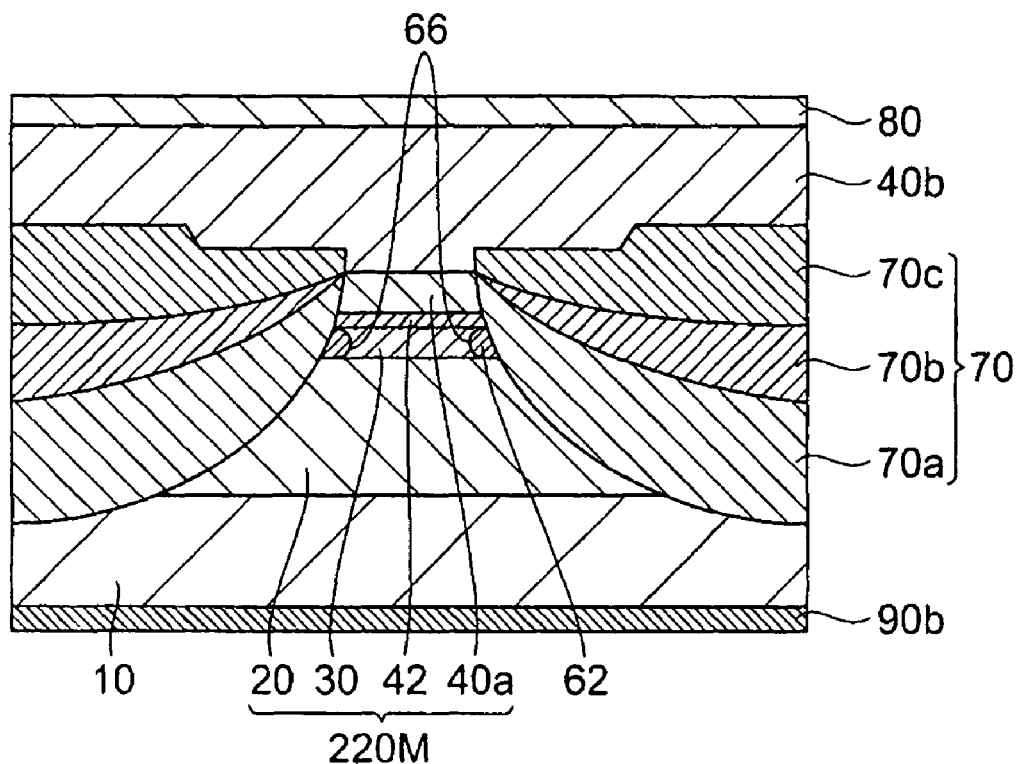
FIG. 15 illustrates a process subsequent to that shown in FIG. 14 to form the device of the third embodiment shown in FIG. 9.

Subsequent to the formation of the mesa 220M, the second upper p-type cladding layer 40b and the p-type contact layer 80 are sequentially grown on the mesa 220M and the burying layer 70 by the MOVPE technique (FIG. 14).

Formation of Insulating Film and Electrodes

Forming the insulating film 64 on the contact layer 80 by the CVD technique and processing this insulating film 64 so as to form the opening aligned with the mesa 220M, the p-type electrode 90a is evaporated so as to cover the contact layer 80 exposed within the opening, while, the n-type electrode 90b is evaporated on the back surface of the substrate 10. It is preferable to thin the substrate 10 to a thickness of about 100 μm before the evaporation of the n-type electrode 90b. Thus, the light-emitting device 1C according to the third embodiment has been completed.

In the device according to the third embodiment described above, the active layer 30 may be surrounded by the first and second protection layers, 42 and 62. The first protection layer 42 is put between the active layer 30 and the upper p-type cladding layer 40a doped with Zn so as to come in directly contact with the active layer 30, while, the second protection layer is put between the active layer 30 and the p-type first layer 70a in the burying layer, which is also doped with Zn, so as to fill the recessed portions 66 in both sides of the active layer 30. Thus, because the protections layers, 42 and 62, doped with Si surrounds the active layer 30, the inter-diffusion of Zn atoms from the p-type layers, 40a and 70a, into the active layer 30 may be effectively prevented by Si atoms contained in the protection layers, 42 and 62, even the subsequent thermal processes are carried out at high temperatures. Moreover, the protection layers, 42 and 62, that contains both impurities of Si and Zn finally operate as the p-type layer due to the inter-diffused Zn atoms. Accordingly, these protection layers, 42 and 62, cause no influence on the carrier transportation in the device.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims. For instance, the semiconductor light-emitting devices, 1A to 1C, may be a light-emitting diode (LEC), an LD with a quantum wired active layer, an LD with a quantum dot active layer, and a surface emitting laser diode with the quantum dot active layer. Moreover, the active layer is not restricted to that with the MQW structure. A single quantum well structure or a bulk structure may be applicable to the active layer. Moreover, the active layer may accompany with a separate confinement heterostructure (MCH) made of AlGaInAs. The p-type substrate may be also applicable to the present invention.

What is claimed is:

1. A method to form a semiconductor light-emitting device, comprising steps of:
    growing a stack of semiconductor layers on a semiconductor substrate, said semiconductor layers including a lower cladding layer, an active layer, and an upper cladding layer in this order, at least one of said lower cladding layer and said upper cladding layer being doped with zinc to show a p-type conduction, said active layer containing aluminum,
    forming a mesa by etching said stack to expose said substrate;
    selectively etching said active layer to form recessed portions in both sides of said active layer;
    forming protection layers so as to fill said recessed portions, said protection layers being doped with silicon; and
    burying said mesa by growing a first layer, a second layer and a third layer, at least one of said first to third layers being doped with zinc to show said p-type conduction.

2. The method according to claim 1,
    wherein said formation of said protection layer is carried out by a mass transportation within an atmosphere of mixed gaseous of phosphine ($PH_3$) and disilane ($Si_2H_6$) at a temperature over 570° C.

3. The method according to claim 2,
    wherein said mixed gaseous further includes arsine ($AsH_3$).

4. The method according to claim 2,
    wherein said active layer is AlGaInAs, and said upper cladding layer and said first layer in said burying layer are p-type InP doped with zinc.

5. The method according to claim 1,
    wherein said grown of said stack is carried out on said semiconductor substrate made of n-type InP doped with tin.

* * * * *